United States Patent [19]

Nagasawa

[11] 4,143,330

[45] Mar. 6, 1979

[54] DETECTOR CIRCUIT

[75] Inventor: Shigeru Nagasawa, Kawasaki, Japan

[73] Assignee: Tokyo Shibaura Electric Co., Ltd., Kawasaki, Japan

[21] Appl. No.: 857,763

[22] Filed: Dec. 5, 1977

[30] Foreign Application Priority Data

Dec. 9, 1976 [JP] Japan .......................... 51-164911[U]

[51] Int. Cl.² .......................... H03D 1/10; H03D 1/18
[52] U.S. Cl. ................................. 329/101; 325/487;
329/168; 329/179; 329/192; 329/205 R
[58] Field of Search ............... 329/101, 168, 178, 179,
329/190, 192, 203–206; 325/487

[56] References Cited

U.S. PATENT DOCUMENTS

| | | | |
|---|---|---|---|
| 3,040,261 | 6/1962 | Dome | 329/203 |
| 3,471,791 | 10/1969 | Scarr et al. | 329/101 |
| 3,688,206 | 8/1972 | Eide | 329/204 |

FOREIGN PATENT DOCUMENTS

| | | | |
|---|---|---|---|
| 2443026 | 3/1975 | Fed. Rep. of Germany | 329/101 |
| 232333 | 4/1969 | U.S.S.R. | 329/168 |

*Primary Examiner*—Siegfried H. Grimm
*Attorney, Agent, or Firm*—Finnegan, Henderson, Farabow & Garrett

[57] ABSTRACT

A detector circuit comprising a detector element which includes a diode having a high-frequency input terminal which receives a predetermined DC bias voltage, and a parallel circuit constituted by a resistor and a capacitor and connected between the output terminal of the detector element and a ground terminal. The detector circuit is further provided with a resistor connected between the parallel circuit and the output terminal of the detector element.

3 Claims, 7 Drawing Figures

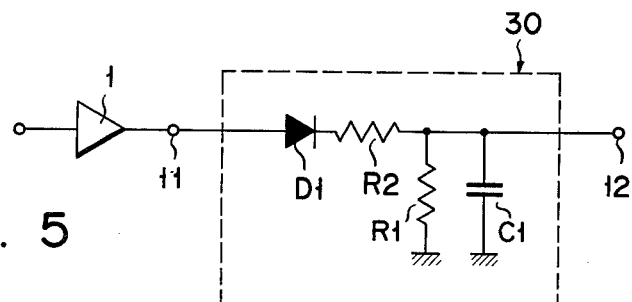
F I G. 5
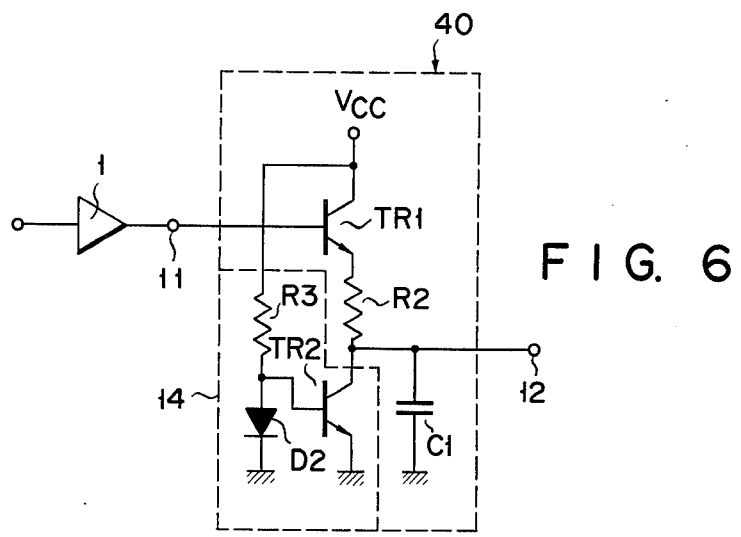
F I G. 6
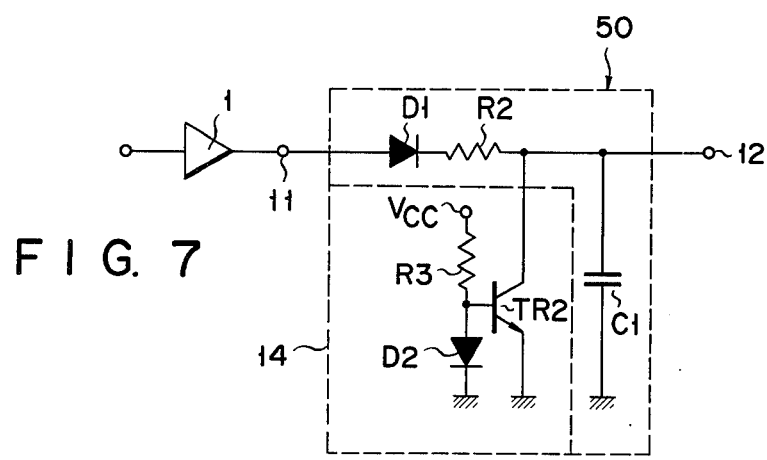
F I G. 7

DETECTOR CIRCUIT

BACKGROUND OF THE INVENTION

This invention relates to a detector circuit having an improved noise cut-off characteristic.

An AM radio receiver or a transceiver may receive extremely small input signals. In this case, an AGC circuit enhances the power gain of the circuit at the stage preceding the intermediate-frequency amplifier circuit. As a result, the noise generated by the high-frequency amplifier circuit is much amplified, and the electro-acoustic converter circuit at the final stage generates noise quite annoying to the ears.

With reference to FIG. 1 the drawbacks of a conventional detector circuit 10 will be explained more in detail.

As shown in FIG. 1, the intermediate-frequency amplifier circuit 1 has its input terminal coupled to the output terminal of the high-frequency amplifier circuit 20 (not shown). The output terminal of the intermediate-frequency amplifier circuit 1 is coupled to the input terminal 11 of the conventional detector circuit 10, i.e. the base of an NPN transistor TR1. In the NPN transistor TR1, the PN junction between the base and emitter functions as a detector element. The collector of the transistor TR1 is connected to a power source $V_{CC}$, while the emitter is grounded through a resisor R1 and connected to a low-frequency output terminal 12. To the resistor R1, a capacitor C1 is connected in parallel. The base of the transistor TR1 is applied with a DC bias voltage E.

FIG. 2 is a V-I characteristic curve which shows the relationship between the emitter current I of the transistor TR1 and the voltage V between the input terminal 11 (i.e. the base of the transistor TR1) and output terminal 12 of the detector circuit 10. The current at a bias point A is $(E-V_{BE})/R1$, where "$V_{BE}$" denotes the base-emitter voltage of the transistor TR1. If voltage $V_B$ between the input and output terminals 11 and 12 which corresponds to the bias point A is made the reference voltage of high-frequency input signals, even input signals of minute amplitudes are inevitably rectified or detected since the V-I characteristic curve rises very sharply. In this case, the noise in the input signals of minute amplitudes is detected, too, and is inevitably supplied to the electro-acoustic converter circuit in the form of a noise signal.

SUMMARY OF THE INVENTION

The object of this invention is to provide a detector circuit wherein a dead band is provided to minute noise signals thereby to minimize the influence of the minute noise signals on the reproduced sound.

An embodiment of this invention comprises a detector having a high-frequency input terminal, a first resistor coupled to the output terminal of the detector, a second resistor connected between the first resistor and a reference power source point, and a capacitor connected in parallel to the second resistor.

BRIEF DESCRIPTION OF THE DRAWINGS

FIGS. 5, 6 and 7 are circuit diagrams of other embodiments of this invention, respectively.

DETAILED DESCRIPTION OF THE PREFERRED EMBODIMENTS

Figure 1:
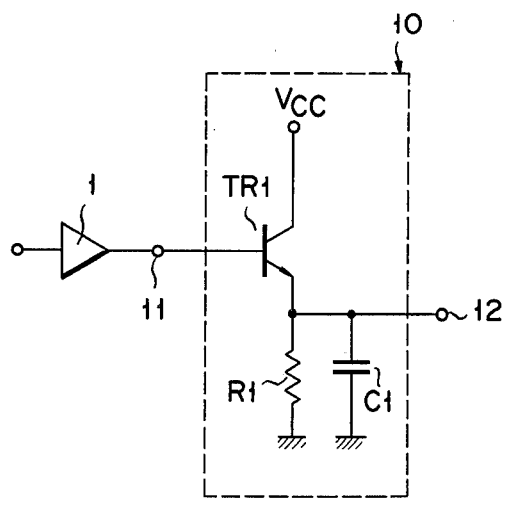
FIG. 1 is a circuit diagram of a conventional detector circuit.
Figure 3:
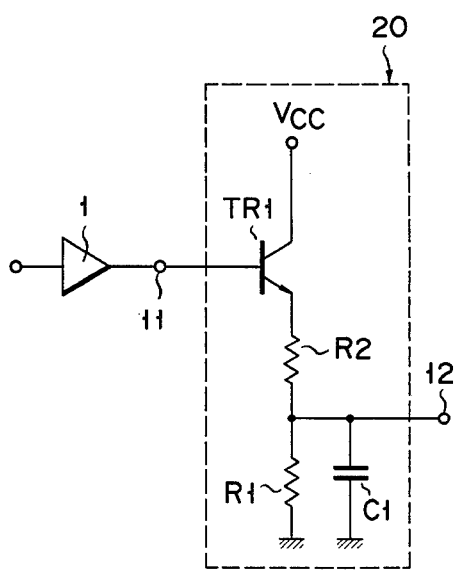
FIG. 3 is a circuit diagram of a detector circuit according to this invention.

FIG. 3 shows a detector circuit 20 according to this invention. In FIG. 3 the circuit elements equivalent to those shown in FIG. 1 are identified by the same reference numerals.

The output terminal of an intermediate-frequency amplifier circuit 1 is coupled to a high-frequency input terminal 11, i.e. the base of an NPN transistor TR1. The base of the transistor TR1 is applied with a DC bias voltage E. The collector of the transistor TR1 is connected to a positive power source $V_{CC}$, while the emitter is grounded through two resistors R2 and R1. To the resistor R1, a filter capacitor C1 is coupled in parallel. The connecting point of the resistors R1 and R2 is connected to a low-frequency output terminal 12.

Figure 2:
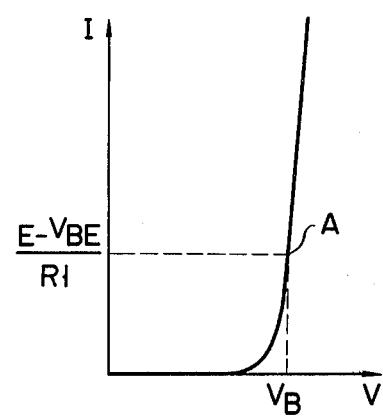
FIG. 2 is a graph showing the V-I characteristic of the detector circuit shown in FIG. 1.
Figure 4:
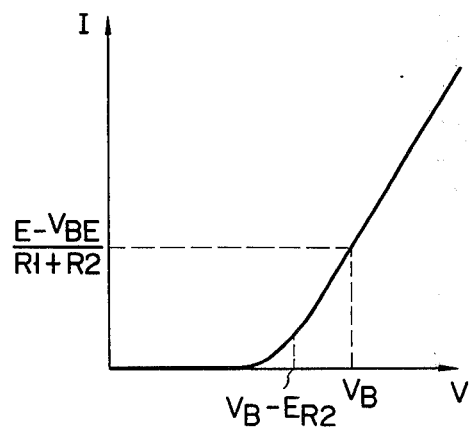
FIG. 4 is a graph showing the V-I characteristic of the detector circuit shown in FIG. 3.

FIG. 4 shows the V-I characteristic of the detector circuit 20 shown in FIG. 3. In the detector circuit 20, the resistor R2 is connected to the resistor R1 in series. For this reason, to generate a current equal to that obtained by the detector circuit 10 shown in FIG. 1, it is necessary to elevate the voltage between the input terminal 11 and output terminal 12. Thus, the V-I characteristic curve rises more slowly than the V-I characteristic curve in FIG. 2, as illustrated in FIG. 4. In this case, the V-I characteristic curve remains linear so long as current can flow through the resistor R2 since the resistor R2 carries out negative feedback operation. The negative half-wave of a high-frequency input signal is therefore scarcely detected if its crest value does not surpass a voltage drop $E_{R2}$ in the resistor R2. Thus, minute noise is effectively suppressed. That is, the detector circuit 20 has a dead band characteristic to minute noises.

The voltage drop $E_{R2}$ in the resistor R2 is expressed in the following equation:

$$E_{R2} = (E - V_{BE}) \frac{R2}{R1 + R2} \qquad (1).$$

In equation (1), "$V_{BE}$" denotes the base-emitter voltage of the transistor TR1.

In case no input signal is supplied to the receiver device, the resistances of the resistors R1 and R2 and the bias voltage E may be selected to be of such values that the crest value of the negative half-wave of a noise signal supplied to the detector circuit is smaller than the voltage drop $E_{R2}$. Then, the detector circuit 20 can suppress the noise signals to minimum. For example, if $V_{CC}$, E, R1, R2 and C1 are selected to be 9V, 4.5V, 3.8KΩ, 100Ω and 0.01μF, respectively, the detector circuit 20 effectively suppresses noise signals supplied thereto.

If the crest value of the negative half-wave of a noise signal supplied to the detector circuit 20 is much greater than the voltage drop $E_{R2}$, the transistor TR1 is cut-off almost all the time. Thus, the detection efficiency is lowered, but only to about $$\left( \frac{R2}{R1 + R2} \right) \times 100 \, (\%).$$

This means that the gain of the detector circuit 20 is affected but very little by the second resistor R2.

FIg. 5 shows another embodiment of this invention, i.e. a detector circuit 30 differs from the detector circuit 20 of FIG. 3 only in that a diode D1 is used in place of the NPN transistor. This detector circuit 30 works effectively in case it can be supplied with a sufficiently large current from an intermediate-frequency amplifier circuit 1. In other words, the detector circuit 30 operates effectively if the amplifier circuit 1 has a sufficiently low output impedance. The detector circuit 30 operates in the same manner as the detector circuit 20 shown in FIG. 3.

This invention is not limited to the above-described two embodiments. The detector circuit 20 may have its first resistor R1 replaced by a constant current source 14, thereby to be modified into such a new detector circuit 40 as shown in FIG. 6. As shown in FIG. 6, the constant current source 14 is constituted by a resistor R3, a diode D2 and a transistor TR2 which has its base connected to a power source $V_{CC}$ through the resistor R3 and grounded through the diode D2, its collector connected to a resistor R2 and its emitter is grounded. Further, the detector circuit 30 may have its first resistor R1 replaced by the constant current source 14 of the detector circuit 40, thereby to be modified into such a new detector circuit 50 as illustrated in FIG. 7. Still further, in the detector circuit 20 or 40, it is possible to make the power source terminal $V_{CC}$ grounded and couple the now grounded terminal to a negative power source terminal.

What is claimed is:

1. A detector circuit comprising a reference potential point, a detector circuit output terminal, a detector element having a high-frequency input terminal and a detector element output terminal, resistor means coupled between said detector element output terminal and said detector circuit output terminal, a constant current source coupled between said detector circuit output terminal and said reference potential point, and capacitor means coupled between said detector circuit output terminal and said reference potential point.

2. A detector circuit according to claim 1, wherein said detector element is constituted by a transistor of which the base is connected to receive a high-frequency input signal and a predetermined DC bias voltage, the emitter is connected to said resistor means and the collector is connected to receive a constant voltage.

3. A detector circuit according to claim 1, wherein said detector element is constituted by a diode.

* * * * *